(12) United States Patent
Seo et al.

(10) Patent No.: US 11,978,803 B2
(45) Date of Patent: May 7, 2024

(54) FLEXIBLE DISPLAY AND METHOD OF MANUFACTURING THE SAME

(71) Applicant: SAMSUNG DISPLAY CO., LTD., Yongin (KR)

(72) Inventors: Sang-Joon Seo, Yongin-Si (KR); Hoon-Kee Min, Yongin-Si (KR); Dong-Un Jin, Yongin-Si (KR); Sung-Guk An, Yongin-Si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 126 days.

(21) Appl. No.: 17/329,306

(22) Filed: May 25, 2021

(65) Prior Publication Data
US 2021/0288173 A1 Sep. 16, 2021

Related U.S. Application Data

(63) Continuation of application No. 13/975,054, filed on Aug. 23, 2013, now abandoned, which is a
(Continued)

(30) Foreign Application Priority Data

Aug. 3, 2010 (KR) .......................... 10-2010-0074979

(51) Int. Cl.
*H01L 29/786* (2006.01)
*C23C 16/34* (2006.01)
(Continued)

(52) U.S. Cl.
CPC .......... *H01L 29/786* (2013.01); *C23C 16/345* (2013.01); *C23C 16/401* (2013.01);
(Continued)

(58) Field of Classification Search
None
See application file for complete search history.

(56) References Cited

U.S. PATENT DOCUMENTS 6,450,025 B1 * 9/2002 Wado .................... B81B 3/0072
73/204.26
6,460,025 B1    9/2002 Wado et al.
(Continued)

FOREIGN PATENT DOCUMENTS

EP    1 849 593 A1    10/2007
GB    1164418         8/1969
(Continued)

OTHER PUBLICATIONS

Derwent2009-H18278Full(2009).
(Continued)

*Primary Examiner* — Kenneth J Stachel
(74) *Attorney, Agent, or Firm* — F. CHAU & ASSOCIATES, LLC

(57) ABSTRACT

A substrate for a flexible display is disclosed. The substrate has a film stress range that does not affect an electronic device such as a thin film transistor, and includes a barrier layer having excellent oxygen and moisture blocking characteristics, and a method of manufacturing the substrate. The substrate includes; a plastic substrate having a glass transition temperature from about 350° C. to about 500° C.; and a barrier layer disposed on the plastic substrate, having a inti layer structure, wherein at least one silicon oxide layer and at least one silicon nitride layer are alternately stacked on each other, and having a film stress from about −200 MPa to about 200 MPa due to the at least one silicon oxide layer and the at least one silicon nitride layer.

17 Claims, 5 Drawing Sheets

Related U.S. Application Data continuation of application No. 13/087,300, filed on Apr. 14, 2011, now abandoned.

(51) Int. Cl.
*C23C 16/40* (2006.01)
*G02F 1/1333* (2006.01)
*H01L 29/66* (2006.01)

(52) U.S. Cl.
CPC .... *H01L 29/6675* (2013.01); *G02F 1/133305* (2013.01); *G02F 2201/501* (2013.01); *Y10T 428/26* (2015.01)

(56) References Cited

U.S. PATENT DOCUMENTS

| | | | |
|---|---|---|---|
| 2002/0094388 A1 | 7/2002 | Fonash et al. | |
| 2004/0012028 A1* | 1/2004 | Park | H01L 27/3244 257/88 |
| 2005/0037240 A1* | 2/2005 | Haoto | C23C 14/0676 204/192.15 |
| 2005/0082641 A1 | 4/2005 | Leedy | |
| 2005/0179379 A1* | 8/2005 | Kim | H05B 33/04 313/503 |
| 2006/0148141 A1* | 7/2006 | Seo | H01L 27/124 438/164 |
| 2006/0158111 A1 | 7/2006 | Hayashi | |
| 2007/0222338 A1 | 9/2007 | Aono et al. | |
| 2009/0051272 A1* | 2/2009 | Fukuda | H01J 37/32165 428/218 |
| 2010/0025677 A1 | 2/2010 | Yamazaki et al. | |
| 2010/0163874 A1 | 7/2010 | Koyama et al. | |
| 2010/0193949 A1 | 8/2010 | Belanger et al. | |
| 2010/0201929 A1 | 8/2010 | Okada et al. | |
| 2011/0121354 A1 | 5/2011 | Schmid et al. | |
| 2012/0228616 A1* | 9/2012 | Auman | C08G 73/105 257/E29.289 |
| 2013/0341629 A1 | 12/2013 | Seo et al. | |

FOREIGN PATENT DOCUMENTS

| | | | |
|---|---|---|---|
| JP | H0613593 | | 1/1994 |
| JP | 06-175116 | | 6/1994 |
| JP | 08-068990 | | 3/1996 |
| JP | 08068990 | * | 3/1996 |
| JP | H0868990 | | 3/1996 |
| JP | 2003-305800 | | 10/2003 |
| JP | 2006-247894 | | 9/2006 |
| KR | 100225100 | * | 10/1999 |
| KR | 10-0488939 | | 5/2005 |
| KR | 10-0581626 | | 5/2006 |
| KR | 10-0732827 | | 6/2007 |
| KR | 100732827 | * | 6/2007 |
| KR | 10-2009-0047885 | | 5/2009 |
| KR | 10-2009-0054538 | | 6/2009 |
| KR | 10-2009-0121241 | | 11/2009 |
| WO | WO 2009095005 | | 8/2009 |

OTHER PUBLICATIONS

Hydrogen Dependence of Film Properties of High Tensile Stree UV Cured Silicon Nitride for 45 NM Bulk Device Tian (2009).
R.E. Sah et al., Low-Temperature, Plasma Deposition of Passivating Layers With Low Hydrogen Content for Optoelect Device, Electrochemical Society Proc. vol 96-2 pp. 201-220 (1996).
Recent Situation of Industrial Implementation of Cat-CVD Technology in Japan, Hideki Matsumura et al, Thin Solid Films 516 (2008) 537-540.

* cited by examiner

FLEXIBLE DISPLAY AND METHOD OF MANUFACTURING THE SAME

CROSS-REFERENCE TO RELATED APPLICATIONS

This application is a continuation of U.S. Patent. application Ser. No. 13/975,054, filed on Aug. 23, 2013 in the U.S. Patent and Trademark Office, which is a continuation of U.S. patent application Ser. No. 13/087,300, filed on Apr. 14, 2011 in the U.S. Patent and Trademark Office, which claims priority from Korean Patent Application No. 10-2010-0074979, tiled on Aug. 3, 2010 in the Korean Intellectual Property Office, the contents of all of which are incorporated herein by reference in their entireties.

BACKGROUND

1. Field

The present disclosure relates to a substrate for a flexible display, and a method of manufacturing the substrate.

2. Description of the Related Technology

Markets of liquid crystal display devices and organic light emitting display devices are currently expanding to displays of digital cameras, video cameras, and mobile devices, such as personal digital assistants (PDAs) and mobile phones. The displays of mobile devices need to be thin, light, and moreover, unbreakable. In order to form a thin and light display, a method of preparing a display by using a conventional glass substrate, and then thinning the glass substrate mechanically or chemically has been introduced, besides a method of preparing a display by using a thin glass substrate. However such methods are complicated and the glass substrate may easily break, and thus the methods are difficult to be actually used. Also, for the mobile devices to be easily carried and to be applied to display devices of various shapes, the displays may be flexible to realize a curved surface. However, it is difficult for the conventional glass substrate to have flexibilaity.

Accordingly, there have been attempts to manufacture a display device by using a plastic substrate, but the plastic substrate has high level of moisture and oxygen penetration and is not suitable for a high temperature process.

SUMMARY OF CERTAIN INVENTIVE ASPECTS

One aspect of the present invention provides a substrate for a thin, flexible display, which has film stress range that does not affect an electronic device, such as a thin film transistor, and includes a barrier layer having excellent oxygen and moisture blocking characteristics, and a method of manafacturing the substrate.

According to the aspect of the present invention, the substrate including: a plastic substrate having a glass transition temperature from about 350° C. to about 500° C.; and a barrier layer disposed on the plastic substrate, having a multi-layer structure, wherein at least one silicon oxide layer and at least one silicon nitride layer are alternately stacked on each other, and having a film stress from about −200 MPa to about 200 MPa due to the at least one silicon oxide layer and the at least one silicon nitride layer.

The barrier layer may include: a first silicon oxide layer; a silicon nitride layer stacked on the first silicon oxide layer; and a second silicon oxide layer stacked on the silicon nitride layer.

The barrier layer may include: a first silicon oxide layer; a first silicon nitride layer stacked on the first silicon oxide layer; a second silicon oxide layer stacked on the first silicon nitride layer; a second silicon nitride layer stacked on the second silicon oxide layer; and a third silicon oxide layer stacked on the second silicon nitride layer.

The barrier layer may include: a first silicon oxide layer; a first silicon nitride layer stacked on the first silicon oxide layer; a second silicon oxide layer stacked on the first silicon nitride layer; a second silicon nitride layer stacked on the second silicon oxide layer, a third silicon oxide layer stacked on the second silicon nitride layer; a third silicon nitride layer stacked on the third silicon oxide layer; and a fourth silicon oxide layer stacked on the third silicon nitride layer.

The at least one silicon oxide layer included in the barrier layer may have compressive film stress. The at least one silicon nitride layer included in the barrier layer nay have tensile film stress.

The at least one silicon nitride layer may have a film density from about 2.5 $g/cm^3$ to about 2.7 $g/cm^3$.

The at least one silicon nitride layer may have a hydrogen atom content from about 13% to about 17%.

Each of the at least one silicon nitride layer may have a thickness from about 200 Å to about 1000 Å.

Each of the at least one silicon oxide layer may have a thickness from about 1000 Å to about 3000 Å.

The plastic substrate may include at least one of polyimide, polycarbonate, polyphenylene sulfide, and poly(arylen ether sulfone.

According to another aspect of the present invention, there is provided a method of manufacturing a substrate for a flexible substrate, the method including: providing a plastic substrate having a glass transition temperature from about 350° C. to about 500° C.; and forming a harrier layer having a film stress from about −200 MPa to about 200 MPa by alternately stacking at least one silicon oxide layer and at least one silicon nitride layer on the plastic substrate.

The forming of the barrier layer may include high temperature deposition at a temperature from about 350° C. to about 400° C.

The barrier layer may include; a first silicon oxide layer; a silicon nitride layer stacked on the first silicon oxide layer; and a second silicon oxide layer stacked on the silicon nitride layer.

The barrier layer may include: a first silicon oxide layer; a first silicon nitride layer stacked on the first silicon oxide layer; a second silicon oxide layer stacked on the first silicon nitride layer; a second silicon nitride layer stacked on the second silicon oxide layer; and a third silicon oxide layer stacked on the second silicon nitride layer.

The barrier layer may include: a first silicon oxide layer; a first silicon nitride layer stacked on the first silicon oxide layer; a second silicon oxide layer stacked on the first silicon nitride layer; a second silicon nitride layer stacked on the second silicon oxide layer; a third silicon oxide layer stacked on the second silicon nitride layer; a third silicon nitride layer stacked on the third silicon oxide layer; and a fourth silicon oxide layer stacked on the third silicon nitride layer.

The at least one silicon oxide layer included in the barrier layer may have compressive film stress. The at least one silicon nitride layer included in the barrier layer may have tensile film stress.

The at least one silicon nitride layer may have a film density from about 2.5 $g/cm^3$ to about 2.7 $g/cm^3$.

The at least one silicon nitride layer may have a hydrogen atom content from about 13% to about 17%.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN INVENTIVE EMBODIMENTS

Figure 1:
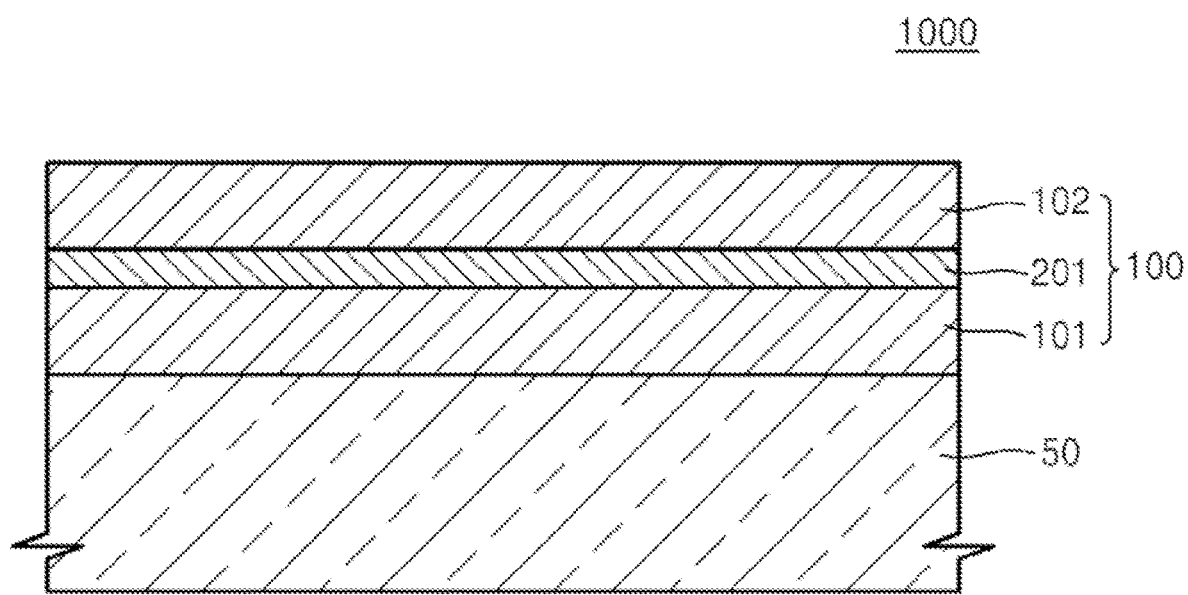
FIG. 1 is a cross-sectional view of a substrate for a flexible display, according to an embodiment of the present invention.

While the invention have numerous embodiments, only some of such embodiments will be illustrated in the drawings and described in detail in the written description. The present invention is not limited to the particular embodiments, and there are changes, modifications and substitutes that do not depart from the spirit and technical scope of the present invention.

While terms of "first," "second," "third," etc., are used to describe various components, such terms do not carry the meaning of order. These terms are used only to distinguish one component from another. Also, in the present specification, the terms of "including" and "having," are intended to mean "comprising" so as to indicate the possibility of existence of any additional features, numbers, steps, actions, components, parts, or combinations.

Now, various features of the present invention will be described more fully with reference to the accompanying drawings, in which exemplary embodiments of the invention are shown.

FIG. 1 is a cross-sectional view of a substrate 1000 for a flexible display, according to an embodiment of the present invention.

The substrate 1000 according to the current embodiment of the present invention includes a plastic substrate 50, and a barrier layer 100 disposed on the plastic substrate 50.

The plastic substrate 50 has flexibility enough to realize a flexible display. Also, the plastic substrate 50 may have a thin film structure for the flexibility.

The plastic substrate 50 may have a glass transition temperature (Tg) from about 350° C. to about 500° C. With this feature, the plastic substrate 50 can stably perform functions of a substrate without being deformed even when the barrier layer 100, a thin film transistor, and an electronic device are formed on the plastic substrate 50 at high temperature. In detail, the barrier layer 100 is formed at a temperature from about 350° C. to about 400° C. Accordingly, if the Tg of the plastic substrate 50 is less than about 350° C., the plastic substrate 50 may change to a rubber having elasticity at about 350° C. and thus may be unable to perform the functions of substrate. On the other hand, the plastic substrate 50 having the Tg exceeding about 500° C. has bad processability.

The plastic substrate 50 may be formed of a polymer having high thermal resistance. For example, the plastic substrate 50 may include at least one material selected from the group consisting of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), cellulose acetate propionate (CAP), and poly(arylen ether sulfone) as a type of engineering plastic. Specifically, PI has excellent mechanical strength and has better thermal resistance than other polymers as the Tg of PI is about 450° C. Accordingly, even when the bather layer 100 is disposed on the plastic substrate 50 including PI at high temperature, the plastic substrate 50 may stably perform the functions of a substrate without drooping due to a weight of the barrier layer 100. Also, the plastic substrate 50 including at least one of the above polymers has high level of oxygen and moisture penetration. Accordingly, when a thin film transistor and an electronic device are directly formed on the plastic substrate 50, the thin film transistor and the electronic device may be exposed to oxygen and moisture penetrating through the plastic substrate 50, and thus lifetime of a display may be remarkably reduced. The barrier layer 100 is provided for blocking the moisture and oxygen formed on the plastic substrate 50.

In embodiments, the barrier layer 100 is formed on the plastic substrate 50, and may have a multi-layer structure, wherein at least one silicon oxide ($SiO_x$) layer and at least one silicon nitride ($SiN_x$) layer are alternately stacked on each other. The barrier layer 100 forms a flat surface on the plastic substrate 50 and blocks unwanted substances, such as oxygen and moisture, from penetrating through the plastic substrate 50. The barrier layer 100 may be formed using a plasma enhanced chemical vapor deposition (PECVD) method using plasma. However, forming the barrier layer 100 is not limited thereto, and any deposition method may be used, such as an atmospheric pressure CVID (APCVD) method or a low pressure CVD (LPCVD) method. According to an embodiment of the present invention, the barrier layer 100 is formed at high temperature so that the barrier layer 100 is thin, has a uniform stress, and has a high film density. Specifically, in embodiments, since the plastic substrate 50 having a high Tg, is used, the barrier layer 100 may be formed at high temperature.

In embodiments, the barrier layer 100 is formed at a temperature from about 350° C. to about 400° C. Accordingly, the barrier layer 100 may be formed to have a uniform film stress, a thin thickness, and a high film density to effectively block moisture and oxygen. Characteristics of the barrier layer 100 will now be described in detail.

Referring to FIG. 1, the barrier layer 100 according to the current embodiment of the present invention includes a first silicon oxide layer 101 formed on the plastic substrate 50, a first silicon nitride layer 201 formed on the first silicon oxide layer 101, and a second silicon oxide layer 102 formed on the first silicon nitride layer 201. Here, the first and second silicon oxide layers 101 and 102 may each have a film stress from about −100 MPa to about −300 MPa, and the first silicon nitride layer 201 may have a film stress from about −50 MPa to about 200 MPa. The film stress denotes a size of strength of a thin film layer per unit area, and may be compressive film stress or tensile film stress. Here, the compressive film stress is indicated with a negative integer, and the tensile film stress is indicated with a positive integer.

Also, the compressive film stress may be power pushing a thin film to bend the thin film downward. On the other hand, the tensile film stress may he power pulling a thin film to bend the thin film upward.

In embodiments, each of the first and second silicon oxide layers 101 and 102 may have compressive film stress, and the first silicon nitride layer 201 may have tensile film stress. Accordingly, with the structure, in which the first silicon oxide layer 101, the first silicon nitride layer 201, and the second silicon oxide layer 102 are alternatively stacked and have different types of film stresses, the barrier layer 100 becomes strong against external shock or bending. Also, the substrate 1000 does not affect a thin film transistor and an electronic device disposed on the barrier layer 100 in terms of stress.

The barrier layer 100 has a film stress from about −200 MPa to about 200 MPa. When the film stress of the barrier layer 100 is below about −200 MPa or above about 200 MPa, the substrate 1000 including the barrier layer 100 may bend upward or downward. In this case, the substrate 1000 may be stuck in an equipment during transference or operation. Also, when the film stress of the barrier layer 100 is below about −200 MPa or above about 200 MPa, dislocation may he generated at an interface between a top surface of the barrier layer 100 and another thin film disposed on the top surface of the barrier layer 100 due to an excessive stress. Such dislocation deteriorates characteristics of the thin film transistor and the electronic device disposed on the barrier layer 100. Besides, film quality of the other film disposed on the barrier layer 100 may deteriorate, thereby deteriorating electric characteristics of the electronic device or causing a defect in the electronic device. Alternatively, the barrier layer 100 may have a film stress of about 0 MPa, because the film stress of the barrier layer 100 may be counterbalanced as the first and second silicon oxide layers 101 and 102, and the first silicon nitride layer 201 have different film stresses. Accordingly, even when the barrier layer 100 has the film stress of 0 MPa, each of the first and second silicon oxide layers 101 and 102 and the first silicon nitride layer 201 still has film stress.

Also, The thickness of the first silicon nitride layer 201 may be from about 200 Å to about 1000 Å. Here, the thickness of the first silicon nitride layer 201 is about 200 Å or above since 200 Å is a minimum thickness for forming a thin film. The thickness of the first silicon nitride layer 201 is limited to about 1000 Å or below due to the following reason. When the first silicon nitride layer 201 is formed at high temperature, hydrogen atoms are separated and escape from the first silicon nitride layer 201 as coherence between silicon atoms and the hydrogen atoms decreases, and thus a hydrogen atom content in the first silicon nitride layer 201 decreases. Accordingly, film stress of the first silicon nitride layer 201 changes from compressive film stress to tensile film stress. At this time, when the thickness of the first silicon nitride layer 201 exceeds 1000 Å, the first silicon nitride layer 201 may break or be detached.

In embodiments, each of the first and second silicon oxide layers 101 and 102 may have a thickness from about 1000 Å to about 3000 Å. When the thickness of each of the first and second silicon oxide layers 101 and 102 is below about 1000 Å, the first and second silicon oxide layers 101 and 102 are difficult to be formed, and when the thickness of each of the first and second silicon oxide layers 101 and 102 is above about 3000 Å, a time taken to form the first and second silicon oxide layers 101 and 102 remarkably increases.

In embodiments, moisture and oxygen penetration may be controlled by the hydrogen atom content in the first silicon nitride layer 201 included in the barrier layer 100.

In embodiments, the first silicon nitride layer 201 is formed at a temperature from about 350° C. to about 400° C. using the PECVD technique as follows. The plastic substrate 50 on which a layer is deposited is put into a chamber, and a process temperature is set to be from about 350° C. to about 400° C. under a plasma atmosphere. The first silicon nitride layer 201 is flamed with silane ($SiH_4$) and ammonia ($NH_3$). The silane is decomposed into silicon (Si) atoms and hydrogen (H) atoms, and the ammonia is decomposed into nitrogen (N) atoms and hydrogen atoms by plasma. These decomposed silicon, hydrogen, and nitrogen atoms fall onto the plastic substrate 50, and react to form silicon nitride at surface temperature of the plastic substrate 50. Here, the nitrogen atoms and the hydrogen atoms combine with the silicon atoms. Since coherence between the silicon atoms and the hydrogen atoms is weaker than coherence between the silicon atoms and the nitrogen atoms, even when the silicon atoms and the nitrogen atoms maintain the coherence, the silicon atoms and the hydrogen atoms are separated from each other at high temperature. As a result, the hydrogen atoms separated from the silicon atoms form hydrogen molecules ($H_2$) and disappear. Accordingly, when the first silicon nitride layer 201 is formed at high temperature, the hydrogen atom content in the first silicon nitride layer 201 is low. Also, as the hydrogen atom content in the first silicon nitride layer 201 decreases, i.e., as the coherence between the nitrogen atoms and silicon atoms increases, the film stress of the first silicon nitride layer 201 becomes more tensile. Also, as the hydrogen atom content in the first silicon nitride layer 201 decreases, film density of the first silicon nitride layer 201 increases.

In embodiments, the hydrogen atom content in the first silicon nitride layer 201 may be from about 13% to about 17%, because the hydrogen atom content in the first silicon nitride layer 201 depends on the temperature of forming silicon nitride. Experimentally, when a silicon nitride layer is deposited at a temperature from about 350° C. to about 400° C., hydrogen atom content in the silicon nitride layer is from about 13% to about 17%. Also, if the hydrogen atom content in the first silicon nitride layer 201 is below about 13%, film density of the first silicon nitride layer 201 may increase, but tensile film stress of the first silicon nitride layer 201 increases above a threshold value and thus a stress balance of the barrier layer 100 may break. On the other hand, if the hydrogen atom content in the first silicon nitride layer 201 is above about 17%, the film density of the first silicon nitride layer 201 may remarkably decrease, and thus unwanted substances, such as oxygen and moisture, may penetrate into the thin film transistor and the electronic device.

In embodiments, the film density of the first silicon nitride layer 201 may be from about 2.5 $g/m^3$ about 2.7 $g/cm^3$. The film density of the first silicon nitride layer 201 depends on the hydrogen atom content in the first silicon nitride layer 201. When the hydrogen atom content in the first silicon nitride layer 201 is from about 13% to about 17%, the film density of the first silicon nitride layer'201 may be from about 2.5 $g/cm^3$ to about 2.7 $g/cm^3$. If the film density of the first silicon nitride layer 201 is below about 2.5 $g/cm^3$, the function of the first silicon nitride layer 201 for blocking impure elements, such as oxygen and moisture, from penetrating into the thin film transistor and the electronic device may remarkably deteriorate. On the other hand, the film density of the first silicon nitride layer 201 is difficult to exceed about 2 g/cm$^3$ if the hydrogen atom content is from about 13% to about 17%.

Figure 2:
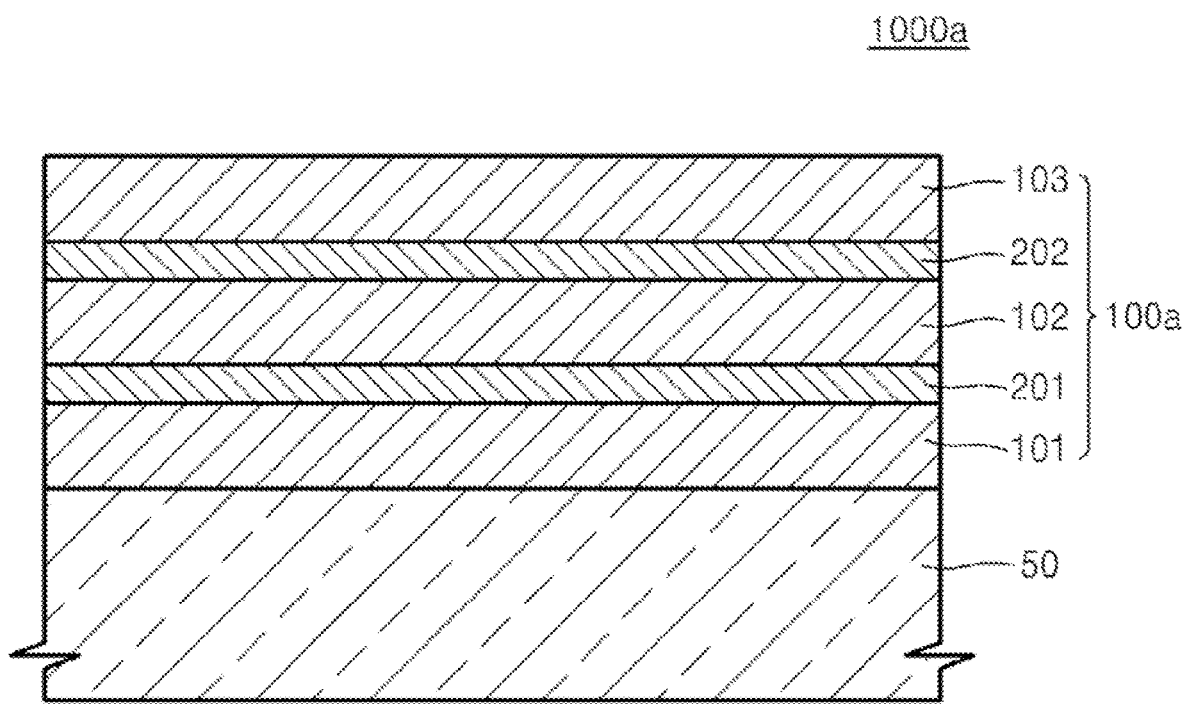
FIG. 2 is a cross-sectional view of a substrate for a flexible display, according to another embodiment of the present invention.

FIG. 2 is a cross-sectional view of a substrate 1000a for a flexible display, according to another embodiment of the present invention. Referring to FIG. 2, the substrate 1000a is similar to the substrate 1000 as at least one silicon oxide layer and at least one silicon nitride layer are alternately stacked on the plastic substrate 50. However, barrier layer 100a of the substrate 1000 includes the first silicon oxide layer 101, the first silicon nitride layer 201 disposed on the first silicon oxide layer 101, the second silicon oxide layer 102 disposed on the first silicon nitride layer 201, a second silicon nitride layer 202 disposed on the second silicon oxide layer 102, and a third silicon oxide layer 103 disposed on the second silicon nitride layer 202. Here, discussions of the barrier layer 100 of FIG. 1 are all applicable to the barrier layer 100a. Specifically, the characteristics of the barrier layer 100 of FIG. 1 are all applicable to the characteristics of the barrier layer 100a, including thicknesses, types of film stresses, contents of hydrogen atoms, film densities. Also, the method of making the oxide layers 101, 102 and nitride layer 202 of the embodiment of FIG. 1 and conditions of forming these layers are also applicable to the embodiment of FIG. 2. Thus, the discussions are not repeated.

Figure 3:
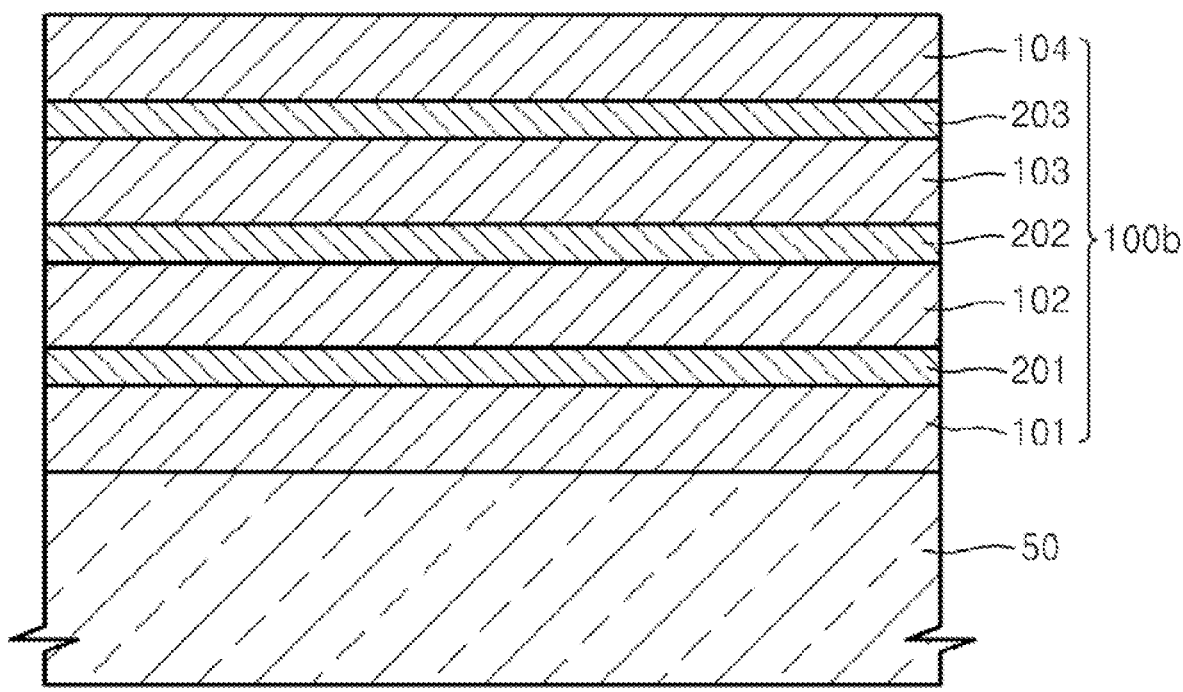
FIG. 3 is a cross-sectional view of a substrate for a flexible display, according to another embodiment of the present invention.

FIG. 3 is a cross-sectional view of a substrate 1000b for a flexible display, according to another embodiment of the present invention. Referring to FIG. 3, the substrate 1000b is similar to the substrates 1000 and 1000a as at least one silicon oxide layer and at least one silicon nitride layer are alternately stacked on the plastic substrate 50. However, barrier layer 100b of the substrate 1000b includes the first silicon oxide layer 101, the first silicon nitride layer 201 disposed on the first silicon oxide layer 101, the second silicon oxide layer 102 disposed on the first silicon nitride layer 201, the second silicon nitride layer 202 disposed on the second silicon oxide layer 102, the third silicon oxide layer 103 disposed on the second silicon nitride layer 202, a third silicon nitride layer 203 disposed on the third silicon oxide layer 103, and a fourth silicon oxide layer 104 disposed on the third silicon nitride layer 203. Here, discussions of the barrier layer 100 of FIG. 1 are all applicable to the barrier layer 100b. Specifically, the characteristics of the barrier layer 100 of FIG. 1 are all applicable to the characteristics of the barrier layer 100b, including thicknesses, types of film stresses, contents of hydrogen atoms, film densities. Also, the method of making the oxide layers 101 102 and nitride layer 202 of the embodiment of FIG. 1 and conditions of forming these layers are also applicable to the embodiment of FIG. 3. Thus, the discussions are not repeated.

Figure 4:
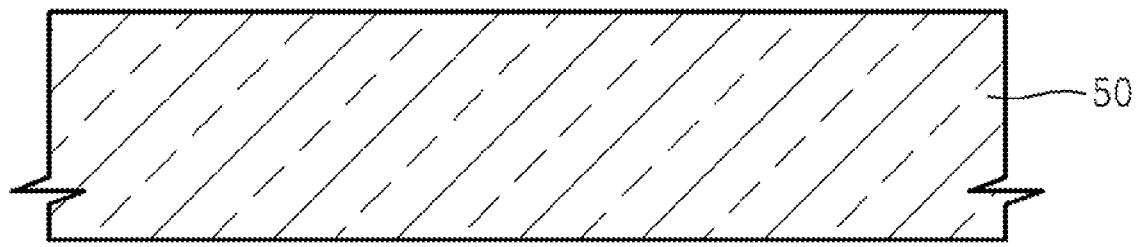
FIGS. 4 through 6 are diagrams for describing a method of manufacturing a display device by using the substrate of FIG. 1, according to an embodiment of the present invention.
Figure 5:
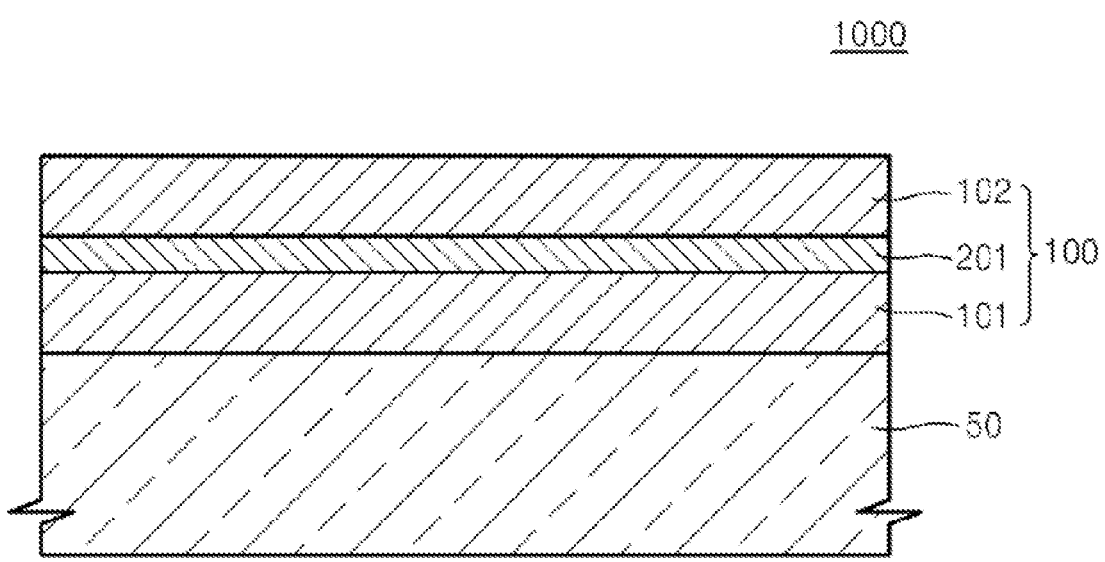
Figure 6:
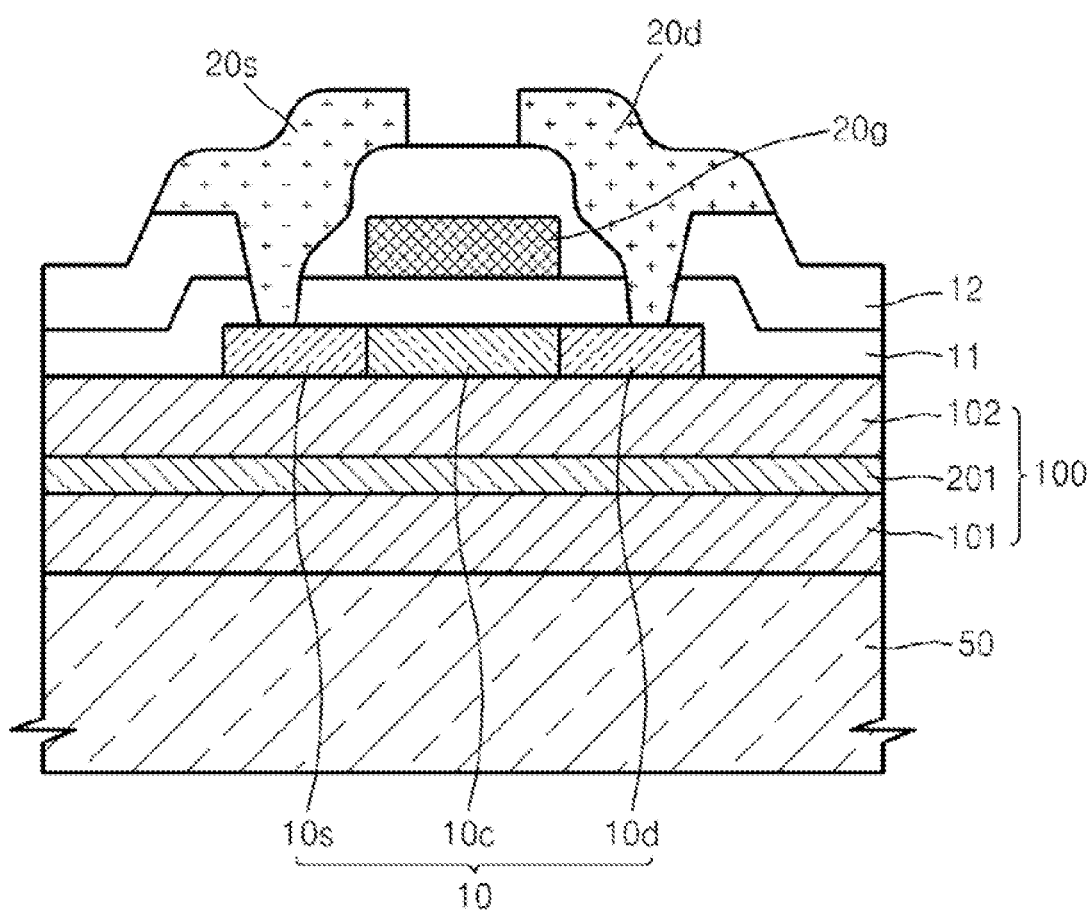

FIGS. 4 through 6 are diagrams for describing a method of manufacturing a display device by using the substrate 1000 of FIG. 1, according to an embodiment of the present invention. Specifically, FIGS. 4 and 5 are diagrams for describing a method of manufacturing the substrate 1000. For the convenience of description, only the method used for the substrate 1000 is described. However, the same method will also be applied to the substrates 1000a and 1000b.

Referring to FIG. 4, first, the plastic substrate 50 is prepared. The Tg of the plastic substrate 50 may be from about 350° C. to about 500° C. so that the plastic substrate 50 stand high temperature treatments.

Referring to FIG. 5, the barrier layer 100 is formed on the plastic substrate 50. Here, the barrier layer 100 is formed at a temperature from about 350° C. to about 400° C. according to a PECVD method. In detail, the barrier layer 100 includes the first silicon oxide layer 101 formed on the plastic substrate 50, the First silicon nitride layer 201 formed on the first silicon oxide layer 101, and the second silicon oxide layer 102 formed on the first silicon nitride layer 201. Here, the thickness of each of the first and second silicon oxide layers 101 and 102 is from about 1000 Å to about 3000 Å, and the thickness of the first silicon nitride layer 201 is from about 200 Å to about 1000 Å. Each of the first and second silicon oxide layers 101 and 102 has compressive film stress, and the first silicon nitride layer 201 has tensile film stress. Also, the film stress of the barrier layer 100 is from about −200 MPa to about 200 MPa. Here, if the film stress of the barrier layer 100 is outside the above range, the substrate 1000 could bend, or dislocation could occur in the interface between the barrier layer 100 and a device that is formed on the barrier layer 100 due to the film stress.

In embodiments, the first silicon nitride layer 201 included in the barrier layer 100 may be formed at a temperature from about 350° C. to about 400° C. according to a PECVD method, by using silane and ammonia. In embodiments, the first silicon nitride layer 201 formed as described above has a hydrogen atom content from about 13% to about 17%, and a film density from about 2.5 g/cm$^3$ to about 2.7 g/cm$^3$. In embodiments, when the hydrogen atom content in the first silicon nitride layer 201 is from about 13% to about 17%, the film density of the first silicon nitride layer 201 may be from about 2.5 g/cm$^3$ to about 2.7 g/cm$^3$ and the first silicon nitride layer 201 may block moisture and oxygen suitably to manufacture the display device.

Referring to FIG. 6, in embodiments, a semiconductor active layer 10, including a source region 10s, a drain region 10d, and a channel region 10c, is patterned and formed on the barrier layer 100, and a first insulation layer 11 is formed on the semiconductor active layer 10. A gate electrode 20g corresponding to the semiconductor active layer 10 is formed on the first insulation layer 11, and a second insulation layer 12 is formed on the gate electrode 20g. A contact hole (not shown) is formed in the first and second insulation layers 11 and 12, and a source electrode 20s and a drain electrode 20d are formed on the second insulation layer 12 and are electrically connected to the semiconductor active layer 10 through the contact hole, thereby completing the manafacture of a thin film transistor. Also, although not illustrated in FIG. 6, a flexible display may be manufactured by further forming a capacitor and an electronic device such as an organic light emitting device (OLED).

When the barrier layer is not formed at high temperature, the silicon oxide layer and silicon nitride layer may need to be thick so as to prevent moisture and oxygen from penetrating. Alternatively, when the barrier layer is formed at a low temperature, particles of the barrier layer are loose, and thus film stress of the barrier layer is high and a hydrogen atom content is high. Accordingly, film density of the barrier layer is low. As a result, when the barrier layer is formed at low temperature, the barrier layer may have a high film stress, and thus a thin film transistor and an electronic device are adversely affected, moisture and oxygen blocking characteristics are low. However, according to embodiments of the present invention, these can be resolved by forming the barrier layer at high temperature and with the use of a plastic substrate having a high Tg.

FIG. 6 illustrates a top gate thin film transistor that can be formed over a barrier layer according to embodiments of the invention. However, alternatively a bottom gate thin film transistor can be formed similarly. Also, only one thin film transistor is shown in FIG. 6, but this is only for convenience of description, and a plurality of thin film transistors, a plurality of capacitors, or a plurality of OLEDs may be included.

In addition, in FIG. 6, the substrate 1000 is used as a lower substrate formed below the thin film transistor and the electronic device, but the substrate 1000 may also be disposed in an encapsulating member, in other words, the encapsulating member including the substrate 1000 is separately formed, and the encapsulating member is combined to an OLED, thereby easily encapsulating the OLED.

Also, the substrate 1000 may be used for any one of various flat display devices, such as organic light emitting display devices and liquid crystal display devices.

According to a substrate for a flexible display and a method of manufacturing the substrate according to one or more embodiments of the present invention, a barrier layer is formed on a plastic substrate at high temperature, and thus the substrate having a thin thickness and film stress range that does not adversely affect a thin film transistor and an electronic device may be provided.

Also, the barrier layer includes a silicon nitride layer that has a low hydrogen atom content in the silicon nitride layer. Thus, the silicon nitride layer has a high film density, thereby highly efficiently blocking moisture and oxygen penetration.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A flexible display, comprising:
a flexible substrate;
a barrier layer directly on the flexible substrate, wherein the barrier layer comprises a first silicon oxide layer, a second silicon oxide layer disposed under the first silicon oxide layer, and a first silicon nitride layer interposed between the first silicon oxide layer and the second silicon oxide layer so as to directly contact the first silicon oxide layer and the second silicon oxide layer, respectively; wherein the second silicon oxide layer is directly on the flexible substrate;
a thin-film transistor on the barrier layer, wherein thin-film transistor comprises a semiconductor active layer and a gate electrode disposed on the semiconductor active layer, wherein the gate electrode is disposed over the semiconductor active layer; and
a first insulation layer disposed on the semiconductor active layer in a direction parallel to an upper surface of the barrier layer and overlapping both sides of the semiconductor active layer perpendicular to the parallel direction and extending from each perpendicular side over the barrier layer, wherein the gate electrode is disposed on the first insulation layer, and the first insulation layer and the semiconductor active layer are interposed between the barrier layer and the gate electrode,
wherein the semiconductor active layer and first insulation layer are disposed directly on the barrier layer, and
wherein the first silicon oxide layer and the second silicon oxide layer have a compressive or tensile type of film stress, and the first silicon nitride layer has a different type of film stress than the first silicon oxide layer and the second silicon oxide layer, and a stress of the barrier film with a range of −200 MPa to 200 MPa that is a sum of stresses of the first and second silicon oxide layers and the first silicon nitride layer.

2. The flexible display of claim 1, wherein the first silicon nitride layer has a hydrogen atom content from about 13% to about 17%.

3. The flexible display of claim 1, wherein each of the first silicon oxide layer and the second silicon oxide layer has a compressive film stress, and the first silicon nitride layer has a tensile film stress.

4. The flexible display of claim 1, wherein each of the first silicon oxide layer and the second silicon oxide layer has a compressive film stress for an entire range of from about 300 MPa to about 100 MPa, and wherein the first silicon nitride layer has a tensile film stress for an entire range of from about −50 MPa to about 200 MPa.

5. The flexible display of claim 1, wherein a film density of the first silicon nitride layer is from about 2.5 g/cm$^3$ to about 2.7 g/cm$^3$.

6. The flexible display of claim 1, wherein the flexible substrate comprises polyimide.

7. The flexible display of claim 1, further comprising:
an organic light-emitting device (OLED) in electric contact with the thin-film transistor; and
an encapsulating member that encapsulates the OLEO.

8. The flexible display of claim 1, wherein the flexible substrate comprises a plastic substrate that has a glass transition temperature from about 350° C. to about 500° C.

9. The flexible display of claim 1, wherein a thickness of the first silicon nitride layer is thinner than a thickness of one of the first silicon oxide layer or the second silicon oxide layer.

10. The flexible display of claim 6, wherein the thickness of the first silicon nitride layer is from about 200 Å to about 1000 Å and the thickness of each of the first silicon oxide layer and the second silicon oxide layer is from about 1000 Å to about 3000 Å.

11. The flexible display of claim 1, wherein the barrier layer comprises:
a second silicon nitride layer stacked directly under the second silicon oxide layer; and
a third silicon oxide layer stacked directly under the second silicon nitride layer wherein the second silicon nitride layer has a hydrogen atom content from about 13% to about 17%.

12. The flexible display of claim 8, wherein the barrier layer comprises:
a third silicon nitride layer stacked directly under the third silicon oxide layer; and
a fourth silicon oxide layer stacked directly under the third silicon nitride layer.

13. A flexible display, comprising:
a flexible substrate;
a barrier layer directly disposed on the flexible substrate; and
a thin-film transistor disposed on the barrier layer,
wherein the barrier layer comprises a first silicon oxide layer, a second silicon oxide layer disposed over the first silicon oxide layer, and a first silicon nitride layer interposed between the first silicon oxide layer wherein the first silicon oxide layer is directly on the flexible substrate, and the second silicon oxide layer,
wherein a thickness of the first silicon nitride layer is 200 Å to 1000 Å, and is less than a thickness of each of the first silicon oxide layer and the second silicon oxide layer, and
wherein the first silicon oxide layer and the second silicon oxide layer have a compressive type of film stress, and the first silicon nitride layer has a tensile type of film stress, and wherein a stress of the barrier film with a range of −200 MPa to 200 MPa that is a sum of stresses of the first and second silicon oxide layers and the first silicon nitride layer.

14. The flexible display of claim 13, wherein the first silicon nitride layer has a hydrogen atom content from about 13% to about 17%.

15. The flexible display of claim 13, wherein a film density of the first silicon nitride layer is from about 2.5 g/cm$^3$ to about 2.7 g/cm$^3$.

16. The flexible display of claim 13, wherein each of the first silicon oxide layer and the second silicon oxide layer has a film stress of −300 MPa to −100 MPa.

17. The flexible display of claim 13, wherein a film stress of the first silicon nitride layer is a range of −50 MPa to 200 MPa.

\* \* \* \* \*